US006559895B1

(12) United States Patent
Dosho et al.

(10) Patent No.: US 6,559,895 B1
(45) Date of Patent: May 6, 2003

(54) ANALOG MEMORY AND IMAGE PROCESSING SYSTEM FOR REDUCING FIXED PATTERN NOISE

(75) Inventors: Shiro Dosho, Osaka (JP); Naoshi Yanagisawa, Osaka (JP); Masayuki Ozasa, Osaka (JP); Hidehiko Kurimoto, Osaka (JP); Tatsuo Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/508,447

(22) PCT Filed: Sep. 25, 1998

(86) PCT No.: PCT/JP98/04309

§ 371 (c)(1),
(2), (4) Date: Mar. 10, 2000

(87) PCT Pub. No.: WO99/17296

PCT Pub. Date: Apr. 8, 1999

(30) Foreign Application Priority Data

Sep. 29, 1997 (JP) .............................................. 9-263191

(51) Int. Cl.[7] .................................................. H04N 9/78
(52) U.S. Cl. ........................ 348/665; 348/714; 348/615; 365/45
(58) Field of Search ................................ 348/607, 665, 348/714, 615; 365/45, 230.03; 327/553, 552, 332

(56) References Cited

U.S. PATENT DOCUMENTS

| 4,532,541 A | * | 7/1985 | Cooper ..................... 358/21 R |
| 4,597,007 A | * | 6/1986 | Reitmeier et al. ............ 358/31 |
| 5,280,358 A | * | 1/1994 | Yushiya et al. ......... 358/213.17 |
| 5,317,407 A | * | 5/1994 | Michon ...................... 348/306 |
| 5,822,236 A | * | 10/1998 | Dosho et al. ................. 365/45 |
| 5,999,462 A | * | 12/1999 | Katakura et al. ........... 365/194 |

FOREIGN PATENT DOCUMENTS

| JP | 59-117791 | * | 7/1984 |
| JP | 59-154694 | * | 9/1984 |
| JP | 4-305900 | * | 10/1992 |
| JP | 5-189994 | * | 7/1993 |
| JP | 5-260501 | * | 10/1993 |
| JP | 6-504394 | * | 5/1994 |
| JP | 6-189343 | * | 7/1994 |
| JP | 7-21793 | * | 1/1995 |
| JP | 7-122095 | * | 5/1995 |

OTHER PUBLICATIONS

"CMOS Video Filters Using Switched Capacitor 14–MHz Circuits", by K. Matsui et al., IEEE Journal of Solid–State Circuits, vol. SC–20, No. 6, Dec. 1985, pp. 1096–1101.*
"A Monolithic Analog Video Comb Filter in 1.2μm CMOS", by K. Nishimura et al., IEEE Journal of Solid–State Circuits, vol. 28, No. 12, Dec. 1993, pp. 1331–1339.*

* cited by examiner

Primary Examiner—Victor R. Kostak
(74) Attorney, Agent, or Firm—McDermott, Will & Emery

(57) ABSTRACT

Fixed pattern noise of an analog memory is reduced. Transfer paths of an address selection signal (SL) between an address generation unit (10) and respective storage elements (21) for storing an analog signal are constructed to have a substantially uniform electric characteristic in driving the storage elements (21) by the address selection signal (SL) to such an extent that the output signal of the analog memory is free from fixed pattern noise. A buffer unit (50) for temporarily storing and outputting the address selection signal is provided between the address generation unit (10) and the respective storage elements (21), and the buffer unit (50) is constructed to have an output characteristic substantially uniform between the storage elements (21). Also, lines between the buffer unit (50) and the storage elements (21) are constructed to have substantially the same electric characteristic. In this manner, charge feed through noise of the respective storage elements (21) are made substantially uniform, resulting in suppressing the fixed pattern noise.

10 Claims, 9 Drawing Sheets

Charge feed through noise

ANALOG MEMORY AND IMAGE PROCESSING SYSTEM FOR REDUCING FIXED PATTERN NOISE

TECHNICAL FIELD

The present invention relates to an analog memory, and more particularly, it relates to a technique to reduce fixed pattern noise occurring in an output signal of the analog memory. Also, it relates to an image processing system using the analog memory.

BACKGROUND ART

The CMOS-LSI technique has been greatly developing as is generally known, and an analog memory is one of the devices used in the field of analog CMOS-LSI design. An analog memory is a circuit, similar to a digital memory, for storing an input analog signal in a storage element in a specified address and outputting an analog signal stored in a storage element in a specified address.

FIG. 7 is a diagram for showing the basic configuration of a conventional analog memory. As is shown in FIG. 7, the analog memory includes an address generation unit 10, a storage unit 20 including plural storage elements 21, an input circuit 30 and an output circuit 40. One storage element 21 of the storage unit 20 is specified in accordance with an address selection signal SL output from the address generation unit 10. In reading a signal, an analog signal stored in the specified storage element 21 is output as a voltage signal Vout. In writing a signal, an input voltage signal Vin is stored in the specified storage element 21.

PROBLEMS TO BE SOLVED

In the analog memory, a capacity element is generally used as a storage element. However, since a capacity element is easily affected by noise, an offset voltage Vnoise resulting from accumulation of noise in the capacity element is added to the input voltage Vin of the analog memory. It is known that the offset voltage Vnoise is varied depending upon the physical position of a storage element. Specifically, assuming that the storage element has an address n, the output voltage Vout can be represented by the following formula (1):

$$\text{Vout} = \text{Vin} + \text{Vnoise}(n) \quad (1)$$

In other words, the offset voltage Vnoise is represented as a function of the address n of the storage element. Such an offset voltage Vnoise(n) is generally designated as fixed pattern noise.

The fixed pattern noise becomes a serious obstacle when the analog memory is used in image signal processing. In a system dealing with an image signal, the specification of the SN ratio is as strict as −60 dB or less because the eyes of a human being are very sensitive to brightness. Noise appears on a screen unless the fixed pattern noise of the analog memory is reduced so as to satisfy the specification. However, the specification of −60 dB or less is very difficult to attain in an analog circuit.

Various developments have been made so far (for example, Document 1: Matsui, K., T. Matsuura, et al., "CMOS video Filters Using Switched Capacitor 14 MHz Circuits", IEEE J. Solid-State Circuits, pp. 1096–1101, 1985; and Document 2: Ken A. Nishimura, Paul R. Gray, "A Monolithic Analog Video Comb Filter in 1.2-um CMOS", IEEE Journal of Solid-State Circuits, VOL. 28, NO. 12, pp. 1331–1339, December 1993). However, such developments have not been put to practical use due to the fixed pattern noise described above. The problem of the fixed pattern noise has remained unsolved for more than 10 years since the first report.

DISCLOSURE OF THE INVENTION

The present invention was devised in view of the aforementioned problem, and an object is reducing the fixed pattern noise occurring within an analog memory so as to suppress the harmful influence on picture quality in using the analog memory in the image processing, whereby the analog memory is usable in an image processing system.

Specifically, the analog memory of this invention including plural storage elements for storing an analog signal, comprises an address generation unit for outputting an address selection signal for directing any of the plural storage elements to conduct a write or read operation, and transfer paths of the address selection signal between the address generation unit and the plural storage elements are constructed with a substantially uniform electric characteristic in driving the storage elements by the address selection signal to such an extent that an output signal of the analog memory is free from fixed pattern noise.

In the present analog memory, the electric characteristic in driving the respective storage elements by the address selection signal can be made uniform to the extent that the output signal of the analog memory is free from the fixed pattern noise. Accordingly, the charge feed through noise can be made substantially uniform between the storage elements, resulting in suppressing the fixed pattern noise occurring in the output signal of the analog memory.

Preferably, the analog memory further comprises temporary storage means for temporarily storing and outputting the address selection signal disposed between the address generation means and the storage elements, and the temporary storage means is constructed to have an output characteristic substantially uniform with respect to the storage elements.

Furthermore, it is preferred that the temporary storage means is provided with respect to each of the storage means and includes plural flip-flops having substantially the same characteristic. In this manner, the temporary storage means having an output characteristic substantially uniform with respect to the respective storage elements can be realized by a very simple circuit configuration.

Moreover, lines between the temporary storage means and the storage elements are preferably constructed to have substantially the same characteristic.

Further preferably, in the analog memory, plural storage elements are arranged in a two-dimensional array forming a storage unit, the address generation unit outputs, as the address selection signal, a row address selection signal for specifying a row of the storage elements in the array and a column address selection signal for specifying a column of the storage elements in the array, first temporary storage means for temporarily storing and outputting the row address selection signal is disposed between the address generation unit and each row of the storage unit, second temporary storage means for temporarily storing and outputting the column address selection signal is disposed between the address generation unit and each column of the storage unit, and the first temporary storage means is constructed to have an output characteristic substantially uniform with respect to the respective rows of the storage unit and the second temporary storage means is constructed to have an output characteristic substantially uniform with respect to the respective columns of the storage unit.

In this manner, the first and second temporary storage means for suppressing the fixed pattern noise occurring in the output signal of the analog memory are provided with respect to each row and each column of the storage unit. Therefore, as compared with the case where the temporary storage means is provided with respect to each storage element, the circuit scale and the power consumption can be reduced.

Moreover, it is preferred that lines between the first temporary storage means and the storage elements are constructed to have substantially the same electric characteristic, and that lines between the second temporary storage means and the storage elements are constructed to have substantially the same electric characteristic.

In addition, each of the storage elements preferably includes a capacity element; a logic circuit for receiving the row address selection signal and the column address selection signal; and an analog switch disposed between the capacity element and a signal line for transferring an input/output signal to be switched in accordance with an output signal of the logic circuit, and a line between the logic circuit and the analog switch is preferably constructed to have an electric characteristic substantially uniform between the storage elements.

Alternatively, the analog memory of this invention including plural storage elements for storing an analog signal, comprises an address generation unit for outputting an address selection signal for directing any of the plural storage elements to conduct a write or read operation; and temporary storage means for temporarily storing and outputting the address selection signal disposed between the address generation unit and the storage elements, and the temporary storage means is constructed to have an output characteristic substantially uniform with respect to the plural storage elements.

Moreover, it is possible to realize an image processing system comprising a comb filter including the analog memory of this invention for YC separating a composite signal. This image processing system is applicable to various TV systems including the NTSC system and the PAL system.

BEST MODE FOR CARRYING OUT THE INVENTION

Before describing embodiments of the present invention, examination made by the present inventors on the cause of occurrence of fixed pattern noise in an analog memory will be described.

Figure 6:
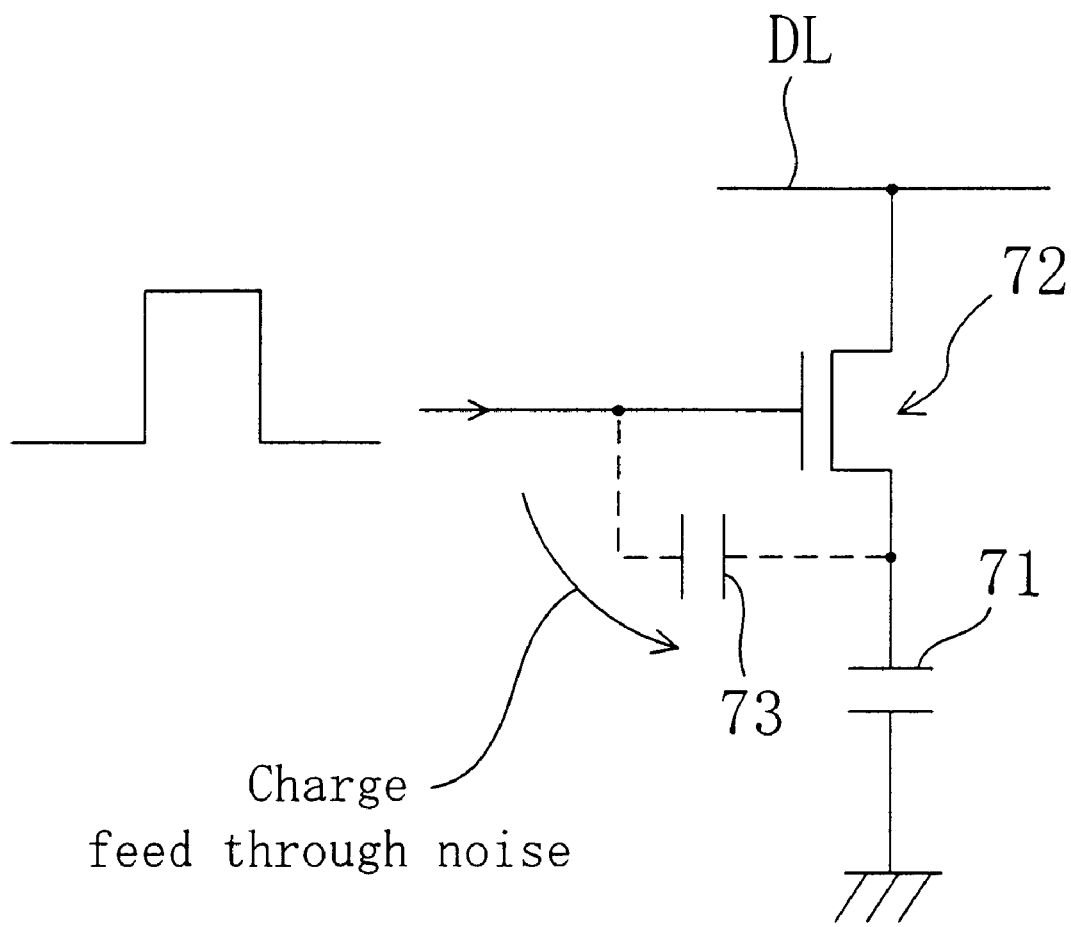
FIG. 6 is a schematic diagram for showing influence of charge feed through noise on a storage element of an analog memory.

FIG. 6 is a diagram for showing the basic configuration of a storage element of an analog memory. As is shown in FIG. 6, the storage element of the analog memory generally includes a capacity element 71 for storing signal charge, and an analog switch 72 formed from a CMOS circuit and disposed between a signal line DL for transferring an analog signal and the capacity element 71. The analog switch 72 is turned on/off in accordance with a pulse signal applied to the gate thereof. At this point, in switching the analog switch 72, charge feed through noise is accumulated as charge in the capacity element 71 through a parasitic capacity 73 of the analog switch 72. It seems that the fixed pattern noise is caused due to variation in the amounts of charge accumulated in respective storage elements.

At this point, the charge feed through noise occurring in a conventional analog memory will be examined.

Figure 7:
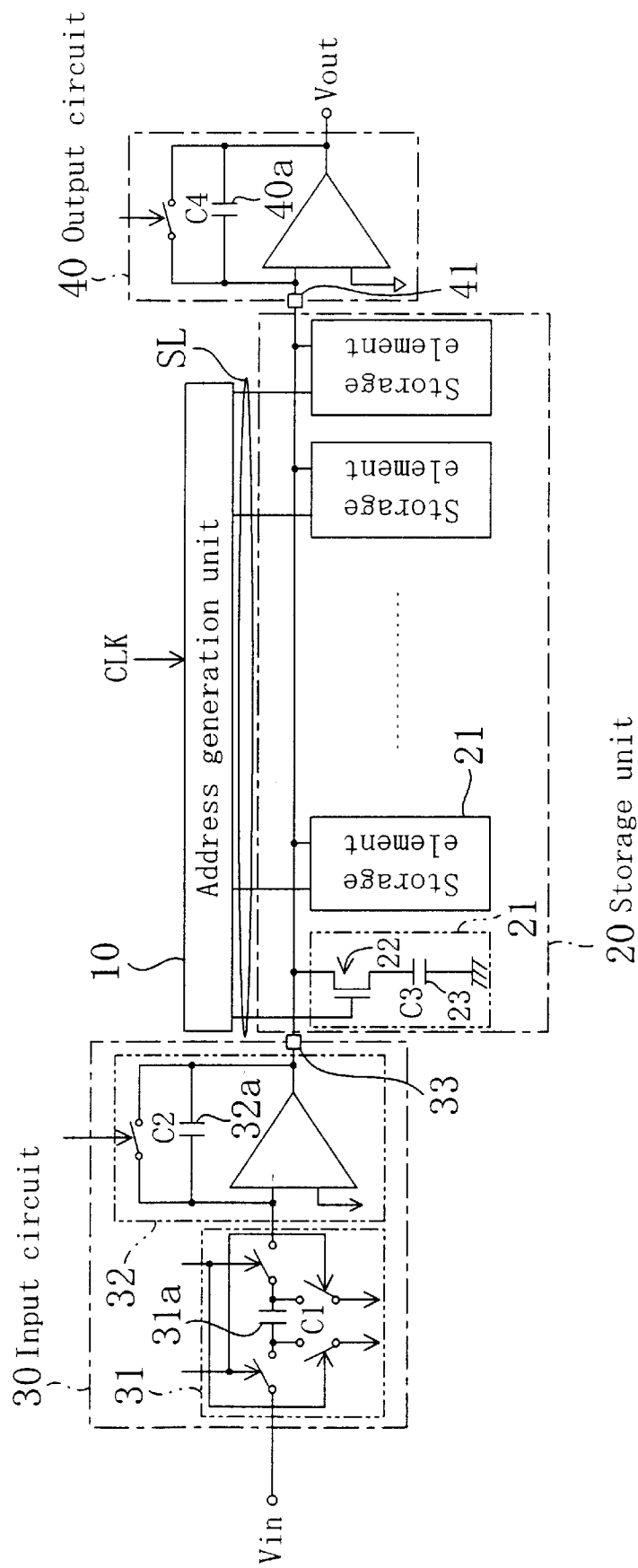
FIG. 7 is a diagram for showing an exemplified configuration of a conventional analog memory.

FIG. 7 is a diagram for showing an exemplified circuit configuration of the conventional analog memory. In FIG. 7, an input signal Vin is input to a switched capacitor sample and hold circuit 31 of the input circuit 30 so as to be stored in a capacity 31$a$ (with a capacity value C1) as charge. The signal stored in the capacity 31$a$ is subsequently transferred to a capacity 32$a$ between input and output (with a capacity value C2) of an operational amplifier 32. Accordingly, the operational amplifier 32 outputs a voltage signal represented by the following formula (2):

$$Vin \times C1/C2 \quad (2)$$

Simultaneously with the output of the voltage signal from the operational amplifier 32, an analog switch 33 is turned on, so as to connect the output of the operational amplifier 32 to the storage unit 20.

The voltage signal output from the operational amplifier 32 is stored in a capacity element 23 (with a capacity value C3) of a storage element 21 selected by the address generation unit 10. Specifically, an analog switch 22 of the selected storage element 21 is turned on, so as to equalize a voltage applied to the ends of the capacity element 23 to the voltage output from the operational amplifier 32, and the settling is then completed. In reading a signal from the capacity element 23, an analog switch 41 is turned on, so as to transfer the charge stored in the capacity element 23 to a capacity 40$a$ (with a capacity value C4) of the output circuit 40. Accordingly, the output circuit 40 outputs a voltage signal Vout represented by the following formula (3):

$$Vout = Vin \times (C1/C2) \times (C3/C4) \quad (3)$$

It is herein assumed that a cyclic shift register as shown in FIG. 8($a$) is used as the address generation unit 10. The cyclic shift register is constructed so that a latch 11a at the first stage alone outputs "H" to the storage element 21 in reset. Thereafter, "H" is successively shifted up to a latch 11h at the eighth stage and cycled to the first latch 11a at the first stage again in synchronization with a clock CLK. In other words, the address generation unit 10 works as a counter so as to successively and repeatedly select each of the storage elements 21.

Figure 8A:
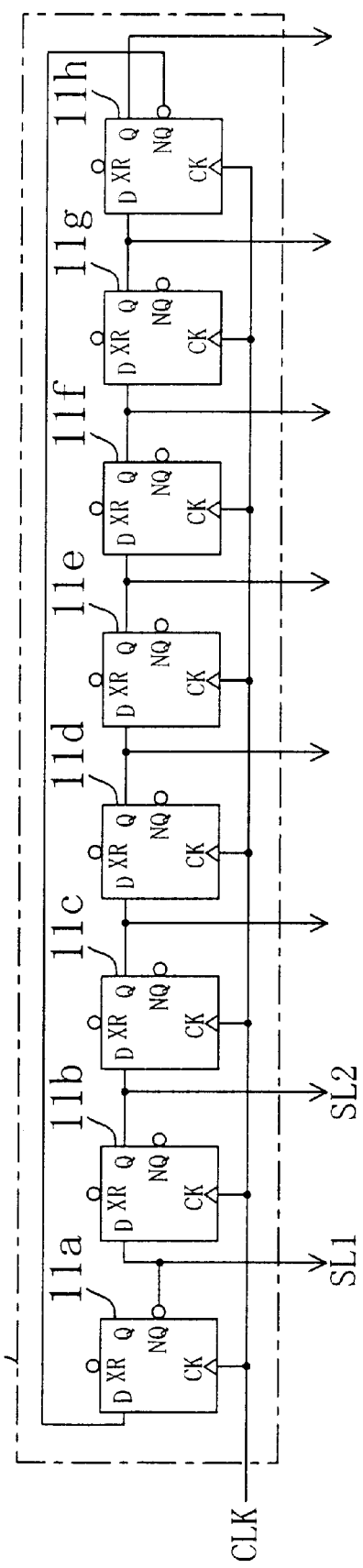
FIGS. 8($a$) and 8($b$) are diagrams for explaining cause of occurrence of fixed pattern noise in the conventional analog memory, wherein FIG. 8($a$) is a diagram for showing an exemplified configuration of an address generation unit of FIG. 7 and FIG. 8($b$) is a diagram for showing a difference in the signal waveform of an address selection signal.
Figure 8B:
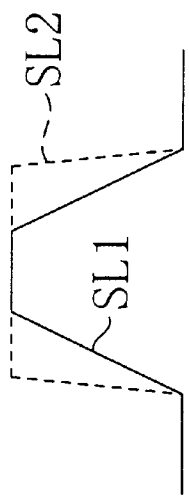

In the configuration of FIG. 8(a), the first latch 11a outputs an inverted output NQ while each of the second through eighth latches 11b through 11h outputs a non-inverted output Q. Therefore, the first latch 11a is different in the output characteristic from the second through eighth latches 11b through 11h. Accordingly, an address selection signal SL1 output from the first latch 11a and an output address signal SL2 output from, for example, the second latch 11b have different signal waveforms as is shown in FIG. 8(b) in driving the analog switch 22 of the storage element 21. As a result, the amount of charge accumulated in the capacity element 23 due to the charge feed through noise is different between the storage element driven by the output of the first latch 11a and the storage element driven by the output of any of the other latches 11b through 11h.

Figure 9:
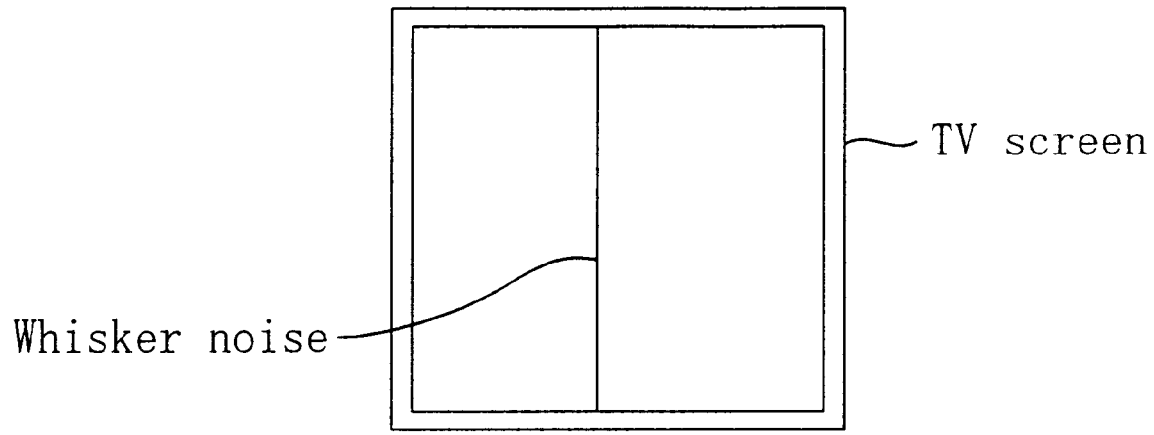
FIG. 9 is a diagram for showing whisker noise appearing on a TV screen due to the fixed pattern noise of an analog signal.

Accordingly, the offset voltage Vnoise of the storage element driven by the output of the first latch 11a is naturally different from the offset voltage Vnoise of the other storage element. This causes the fixed pattern noise. This phenomenon is a fatal fault particularly when the analog memory is used in a TV system. For example, in reading the same DC signal values stored in the analog memory, a portion corresponding to the signal dealt with by the first latch 11a alone appears as whisker noise on a TV screen as shown in FIG. 9.

Since an analog memory is occasionally used as a FIFO memory, the aforementioned configuration as a counter is generally adopted for the address generation unit. Actually, the configuration of the address generation unit 10 is more complicated, and hence, when storage elements are directly driven by the address generation unit, the signal waveform in driving the respective storage elements is more largely varied. Also, the operation timing of a storage element to be driven and the electric characteristics, such as a parasitic capacity on a signal path from the address generation unit to each storage element, are varied. These variation also cause the fixed pattern noise, which seems the cause of the occurrence of the whisker noise.

The present invention was devised on the basis of the aforementioned examination. Now, preferred embodiments of the invention will be described with reference to the accompanying drawings.

EMBODIMENT 1

Figure 1:
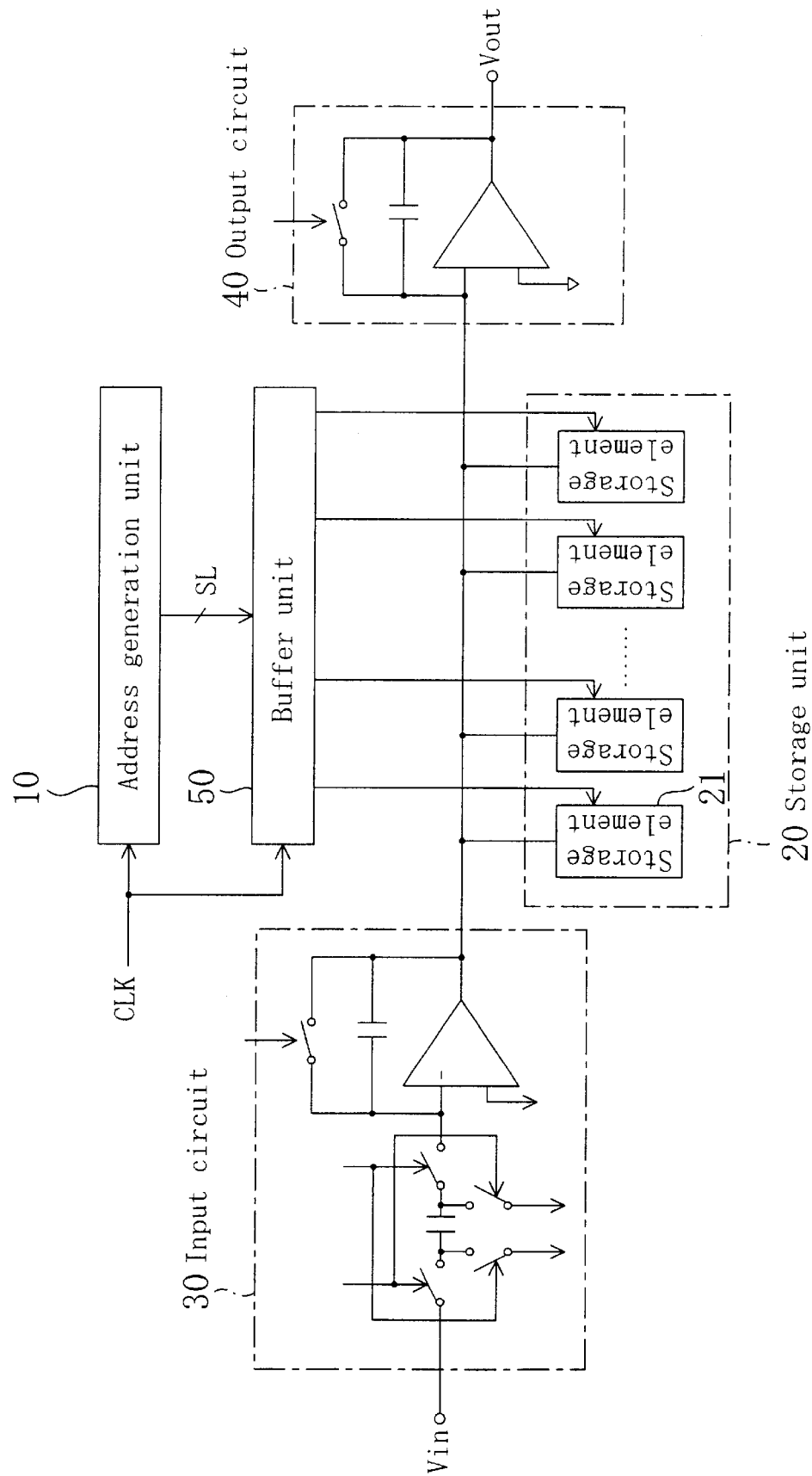
FIG. 1 is a diagram for showing the configuration of an analog memory according to Embodiment 1 of the invention.

FIG. 1 is a diagram for showing the configuration of an analog memory according to Embodiment 1 of the invention. Like reference numerals are used to refer to like elements used in the conventional analog memory of FIG. 7 and the detailed description is omitted.

As is shown in FIG. 1, the analog memory of this embodiment is provided with a buffer unit 50 between an address generation unit 10 and a storage unit 20. The buffer unit 50 serving as temporary storage means temporarily stores an address selection signal SL output from the address generation unit 10 and outputs the address selection signal SL to each storage element 21. In outputting the address selection signal SL, the output characteristic is substantially uniform between the respective storage elements 21. The analog switch of each storage element 21 is driven by the address selection signal SL output from the buffer unit 50. Thus, the electric characteristic in driving the respective storage elements 21 by the address selection signal SL is prevented from varying between the storage elements 21.

Figure 2:
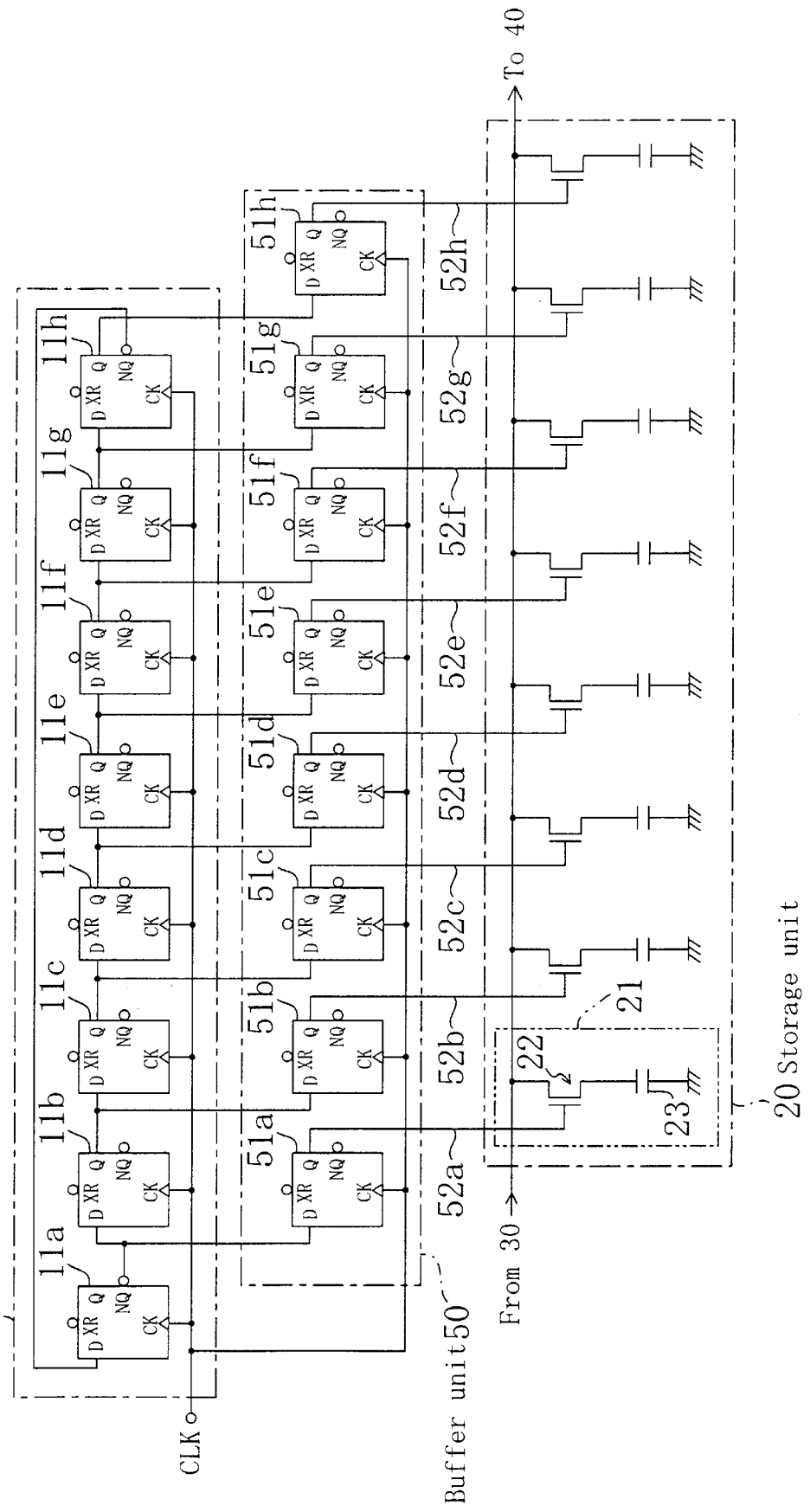
FIG. 2 is a diagram for showing an exemplified configuration of a main part of FIG. 1.

FIG. 2 is a diagram for showing specific configurations of the address generation unit 10, the storage unit 20 and the buffer unit 50 of FIG. 1. In FIG. 2, the address generation unit 10 is constructed from a cyclic shift register, and the buffer unit 50 includes D flip-flops 51a through 51h respectively corresponding to registers 11a through 11h included in the cyclic shift register of the address generation unit 10. The analog switches 22 of the respective storage elements 21 are driven by outputs of the D flip-flops 51a through 51h of the buffer unit 50, respectively.

In the circuit configuration of FIG. 2, the electric characteristic in driving the analog switches 22 of the storage elements 21 by the outputs of the D flip-flops 51a through 51h can be substantially made uniform, and hence, the charge feed through noise can be made substantially uniform between the analog switches 22. Accordingly, no fixed pattern noise occurs in the output signal of the analog memory.

By providing each of the D flip-flops 51a through 51h with the same configuration, the output characteristic of the buffer unit 50 can be made substantially uniform with respect to the respective storage elements 21. Also, the transfer paths of the outputs of the D flip-flops 51a through 51h can be made to have substantially the same electric characteristic by setting lines 52a through 52h connected thereto to have the same length and the same shape. When the analog memory of this embodiment is realized by using an LSI, the mask layout patterns for the lines 52a through 52h for transferring the outputs of the D flip-flops 51a through 51h are preferably designed to be completely the same.

In this manner, the address selection signal SL generated by the address generation unit 10 is temporarily stored in the buffer unit 50 including the D flip-flops 51a through 51h, so as to drive the respective storage elements 21 by the output of the buffer unit 50. Thus, the variation in the electric characteristic in driving the storage elements 21 can be avoided from the viewpoint of both the circuit configuration and the layout.

As a result, by using the analog memory of this embodiment, the whisker noise as is shown in FIG. 9 can be prevented from appearing on the TV screen.

EMBODIMENT 2

In an analog memory according to Embodiment 2 of the invention, storage elements are arranged in a two-dimensional array.

Figure 3:
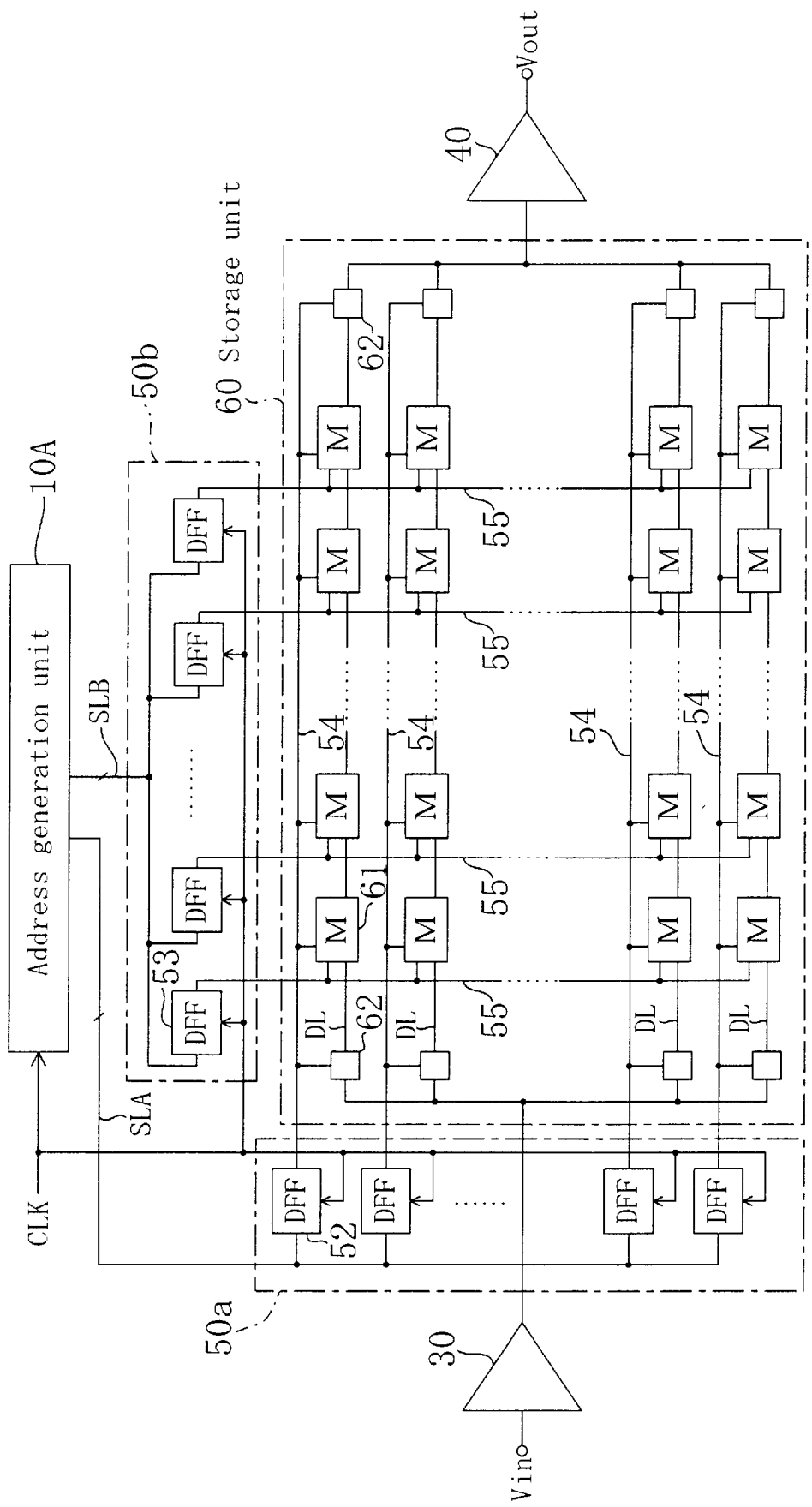
FIG. 3 is a diagram for showing the configuration of an analog memory according to Embodiment 2 of the invention.

FIG. 3 is a diagram for showing the configuration of the analog memory of this embodiment, wherein like reference numerals are used to refer to like elements used in FIG. 1 and the detailed description is omitted.

In FIG. 3, a storage unit 60 includes storage elements 61 (indicated as "M" in FIG. 3) arranged in the two-dimensional array and analog switches 62 disposed on input and output of each row of the array. An address generation unit 10A outputs a row address selection signal SLA and a column address selection signal SLB to the storage unit 60. The row address selection signal SLA is temporarily stored in each D flip-flop (indicated as "DFF" in FIG. 3) included in a row buffer unit 50a working as first temporary storage means, and then transferred to each storage element 61 on the corresponding row of the storage unit 60 through a signal line 54. On the other hand, the column address selection signal SLB is temporarily stored in each D flip-flop 53 included in a column buffer unit 50b working as second temporary storage means, and then transferred to each storage element 61 on the corresponding column of the storage unit 60 through a signal line 55.

Figure 4:
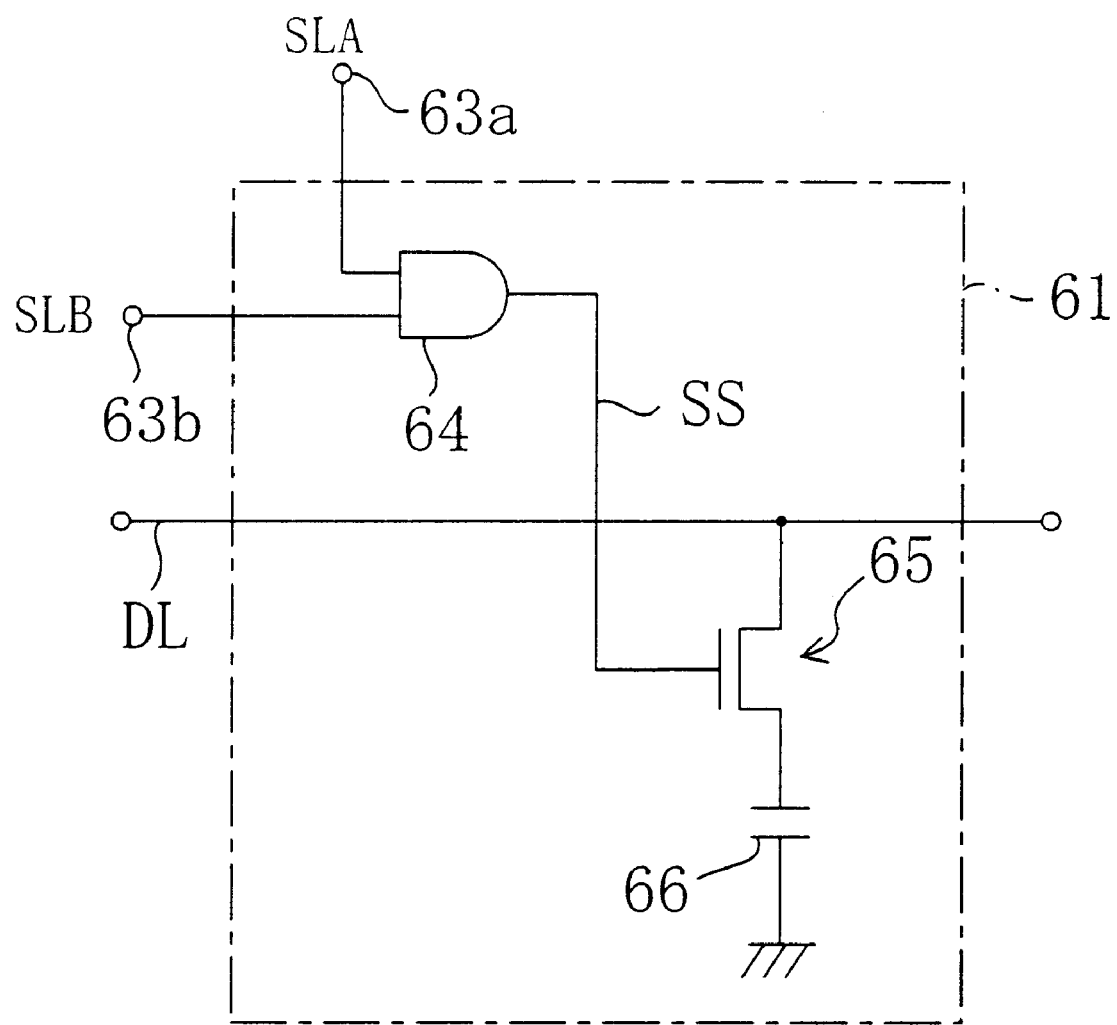
FIG. 4 is a diagram for showing the configuration of a storage element of FIG. 3.

FIG. 4 is a diagram for showing the configuration of the storage element 61. The storage element 61 has two control input terminals 63a and 63b, at which the row address selection signal SLA and the column address selection signal SLB are respectively received. The row address selection signal SLA and the column address selection signal SLB are input to an AND circuit 64 serving as a logic circuit, and merely when both the row address selection signal SLA and the column address selection signal SLB are "H", the logical level of a signal line SS becomes "H", thereby turning an analog switch 65 on.

The output characteristic of the row buffer unit 50a can be made substantially uniform with respect to the respective rows of the storage unit 60 by providing each of the respective D flip-flops 52 with the same configuration. Also, the output characteristic of the column buffer unit 50b can be made substantially uniform with respect to the respective columns of the storage unit 60 by providing each of the D flip-flops 53 with the same configuration.

Furthermore, the signal lines 54 for transferring the row address selection signal SLA are constructed so as to have an electric characteristic substantially uniform with respect to the respective storage elements 61, and the signal lines 55 for transferring the column address selection signal SLB are constructed to have an electric characteristic substantially uniform with respect to the respective storage elements 61.

Moreover, in each of the storage elements 61, the signal line SS from the logic circuit 64 to the analog switch 65 is constructed so as to have an electric characteristic uniform between the storage elements 61.

The circuit configuration of the analog memory of this embodiment is particularly effective when the number of the storage elements 61 is large. As described above, in this embodiment, the D flip-flops are disposed on each of the rows and the columns of the storage unit 60 for forming the temporary storage means. Therefore, the number of the D flip-flops is much smaller than that in Embodiment 1 where the D flip-flops are disposed in the same number as that of the storage elements. Accordingly, this embodiment is remarkably advantageous in the circuit area and power consumption. Furthermore, when the number of the storage elements is large, the circuit shape can be approximated to a square without irregularities by arranging the storage elements in a two-dimensional array. Therefore, the circuit configuration of this embodiment attains another advantage in using the analog memory together with another circuit in LSI design that the length of a wire between circuits can be shortened.

In this manner, in Embodiment 1 of the invention, the electric characteristic in driving the respective storage elements by the address selection signal can be made substantially uniform, which can make substantially uniform the charge feed through noise occurring in the respective storage elements. As a result, the occurrence of the fixed pattern noise in the output signal of the analog memory can be suppressed.

In Embodiment 2 of the invention, the electric characteristic in driving the respective storage elements by the address selection signal can be made substantially uniform even when the storage elements are arranged in a two-dimensional array, and hence, the occurrence of the fixed pattern noise can be suppressed similarly to Embodiment 1. Also, the number of the D flip-flops for forming the temporary storage means can be reduced, resulting in reducing the circuit area and the power consumption.

INDUSTRIAL APPLICABILITY

The analog memory of this invention is applicable to, for example, an image processing system for processing a TV signal and a video signal.

Figure 5A:
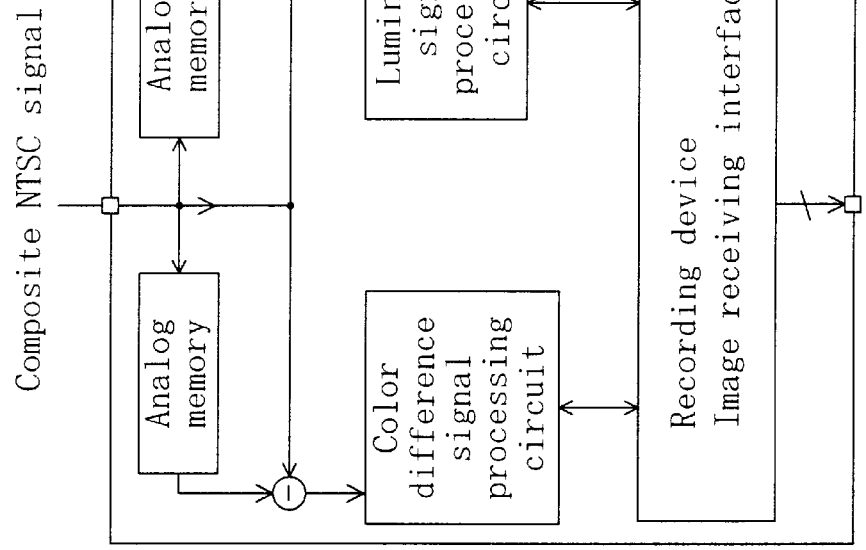
FIG. 5($a$) is a schematic diagram for showing the configuration of a conventional TV signal processing LSI and FIG. 5($b$) is a schematic diagram for showing the configuration of a TV signal processing LSI using an analog memory of the invention.

For example, in a Japanese TV system, storage means for an analog signal is necessary as one component of a comb filter for separating an input composite NTSC signal into a luminance signal (mono-chrome signal) and a color difference signal (color signal). In a currently used TV system, a CCD delay line externally provided to a TV system LSI is used as the storage means for an analog signal as is shown in FIG. 5(a). The CCD delay line is thus externally provided because there is conventionally no device usable as the storage means for an analog signal that can be fabricated by the CMOS process or BiCMOS process, that is, the general fabricating procedures for an LSI, and can satisfy the specification required for processing an image signal.

Figure 5B:
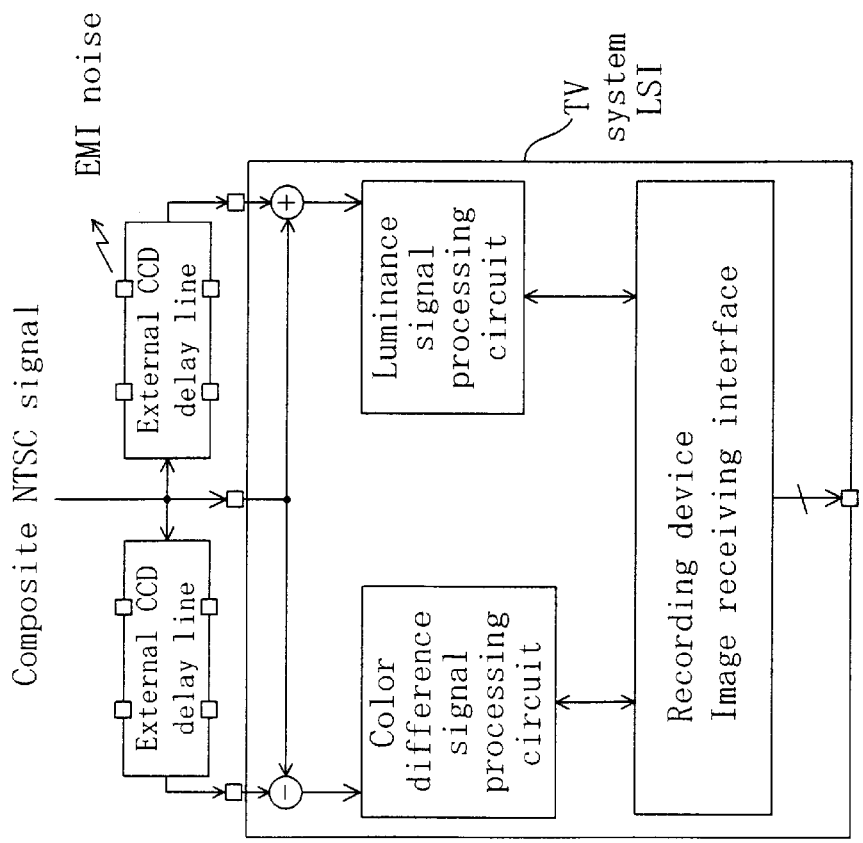

The analog memory of this invention can be used instead of the CCD delay line as the storage means for an analog signal as is shown in FIG. 5(b). In this case, the TV system LSI can be fabricated as a whole by the general CMOS process or BiCMOS process including the analog memory of this invention. Accordingly, the TV system LSI can be realized as a completely one-chip LSI, resulting in largely decreasing the fabrication cost. It is needless to say that the analog memory is applicable to a system other than the NTSC system, for example, the PAL system.

Also, another effect can be attained by using the analog memory of this invention instead of the CCD delay line. The CCD delay line tends to emit digital radiated noise (EMI noise) structurally. Therefore, in the conventional TV system, it is necessary to additionally provide means for preventing the influence of the emission noise, such as a noise removing filter. In contrast, when the TV system LSI is fabricated as a completely one-chip LSI by using the analog memory of this invention, there is no need to provide the means for preventing the noise.

What is claimed is:

1. An analog memory including plural storage elements each for storing an analog signal, comprising:
    an address generation unit for outputting an address selection signal for directing any of said plural storage elements to conduct a write or read operation,
    wherein transfer paths of said address selection signal between said address generation unit and said plural storage elements are constructed with a substantially uniform electric characteristic in driving said storage elements by said address selection signal to such an extent that an output signal of said analog memory exhibits reduced pattern noise.

2. The analog memory of claim 1, further comprising temporary storage means for temporarily storing and outputting said address selection signal disposed between said address generation means and said storage elements,
    wherein said temporary storage means is constructed to have an output characteristic substantially uniform with respect to said plural storage elements.

3. The analog memory of claim 2,
    wherein said temporary storage means includes plural flip-flops provided with respect to each of said storage elements and having substantially the same characteristic.

4. The analog memory of claim 2, wherein lines between said temporary storage means and said storage elements are constructed to have substantially the same electric characteristic.

5. The analog memory of claim 1, wherein said plural storage elements are arranged in a two-dimensional array forming a storage unit, said address generation unit outputs, as said address selection signal, a row address selection signal for specifying a row of said storage elements in said array and a column address selection signal for specifying a column of said storage elements in said array, first temporary storage means for temporarily storing and outputting said row address selection signal is disposed between said address generation unit and each row of said storage unit, second temporary storage means for temporarily storing and outputting said column address selection signal is disposed between said address generation unit and each column of said storage unit, and said first temporary storage means is constructed to have an output characteristic substantially uniform with respect to the rows of said storage unit and said second temporary storage means is constructed to have an output characteristic substantially uniform with respect to the columns of said storage unit.

6. The analog memory of claim 5, wherein lines between said first temporary storage means and said storage elements are constructed to have substantially the same electric characteristic, and lines between said second temporary storage means and said storage elements are constructed to have substantially the same electric characteristic.

7. The analog memory of claim 5, wherein each of said storage elements includes:
    a capacity element;
    a logic circuit for receiving said row address selection signal and said column address selection signal; and
    an analog switch disposed between said capacity element and a signal line for transferring an input/output signal to be switched between a conductive state and an nonconductive state in accordance with an output signal of said logic circuit, and a line between said logic circuit and said analog switch is constructed to have an electric characteristic substantially uniform between said storage elements.

8. An analog memory including plural storage elements each for storing an analog signal, comprising:

an address generation unit for outputting an address selection signal for directing any of said plural storage elements to conduct a write or read operation; and temporary storage means for temporarily storing and outputting said address selection signal disposed between said address generation unit and said storage elements, wherein said temporary storage means is constructed to have an output characteristic substantially uniform with respect to said plural storage elements.

9. An image processing system comprising a comb filter for YC separating a composite signal, wherein said comb filter includes the analog memory of claim 1.

10. The image processing system of claim 9, wherein said image processing system is applicable to an NTSC or PAL system.

* * * * *